US008749236B2

(12) United States Patent
Miyazaki

(10) Patent No.: US 8,749,236 B2
(45) Date of Patent: Jun. 10, 2014

(54) MRI WITH FAT SUPPRESSION USING FAT DECOUPLING RF DURING PRE-SEQUENCE SHIMMING

(75) Inventor: Mitsue Miyazaki, Mount Prospect, IL (US)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 435 days.

(21) Appl. No.: 13/267,673

(22) Filed: Oct. 6, 2011

(65) Prior Publication Data
US 2013/0088226 A1    Apr. 11, 2013

(51) Int. Cl.
*G01V 3/00* (2006.01)
(52) U.S. Cl.
USPC .......................................... 324/318; 324/322
(58) Field of Classification Search
USPC ........................... 324/300–322; 600/409–445
See application file for complete search history.

(56) References Cited

U.S. PATENT DOCUMENTS

| 5,757,188 | A  |   | 5/1998  | Miyazaki |
| 6,879,852 | B1 | * | 4/2005  | Mueller ........................ 600/410 |
| 7,466,132 | B2 | * | 12/2008 | Clarke et al. .................. 324/318 |
| 8,073,525 | B2 | * | 12/2011 | Ladebeck et al. ............. 600/411 |
| 8,126,537 | B2 | * | 2/2012  | Yakubovsky et al. ......... 600/427 |
| 8,131,341 | B2 | * | 3/2012  | Heumann et al. ............. 600/415 |
| 8,172,753 | B2 | * | 5/2012  | Halmann ...................... 600/443 |
| 8,519,705 | B2 | * | 8/2013  | Savukov et al. .............. 324/301 |

* cited by examiner

*Primary Examiner* — Brij Shrivastav
(74) *Attorney, Agent, or Firm* — Nixon & Vanderhye PC

(57) ABSTRACT

A magnetic resonance imaging (MRI) system and method uses an MRI gantry having a static magnet structure, controllable gradient magnet structures and at least one radio frequency (RF) coil for transmitting and receiving RF signals to and from an imaging volume. Control circuits are configured to control gradient magnetic fields generated by the gradient magnet structures, to transmit/receive RF signals to and from the at least one RF coil and to process RF signals received during a diagnostic MRI scan to produce displayable images of structures located within the imaging volume. The control circuits are configured to include a preparatory fat decoupling RF pulse as part of a patient ROI (region of interest) shimming sequence effected prior to a fat suppression type of diagnostic MRI data acquisition scan sequence.

17 Claims, 5 Drawing Sheets

Fat

MRI WITH FAT SUPPRESSION USING FAT DECOUPLING RF DURING PRE-SEQUENCE SHIMMING

FIELD

The subject matter below relates generally to magnetic resonance imaging (MRI) processes incorporating fat suppression techniques to provide better fat-free diagnostic images.

DETAILED DESCRIPTION

Figure 1:
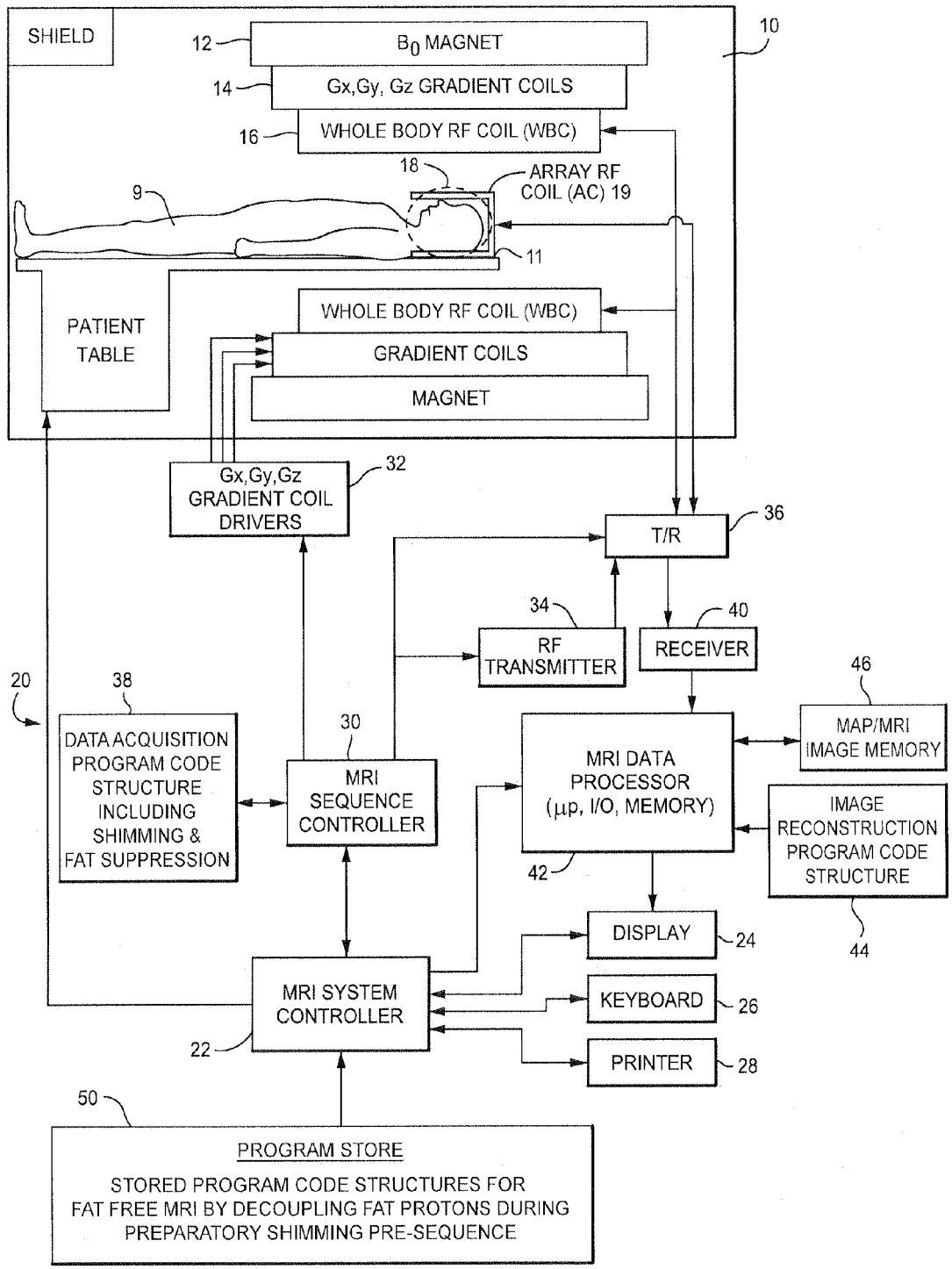
FIG. 1 is a high-level schematic block diagram of an MRI system adapted to acquire and process MRI image data wherein fat content is substantially suppressed in accordance with an exemplary embodiment.

The MRI system shown in FIG. 1 includes a gantry 10 (shown in schematic cross-section) and various related system components 20 interfaced therewith. At least the gantry 10 is typically located in a shielded room. One MRI system geometry depicted in FIG. 1 includes a substantially coaxial cylindrical arrangement of the static field B0 magnet 12, a $G_x$, $G_y$, and $G_z$ gradient coil set 14 and a large whole body RF coil (WBC) assembly 16. Along the horizontal axis of this cylindrical array of elements is an imaging volume 18 shown as substantially encompassing the head of a patient 9 supported by a patient table 11. A smaller array RF coil (AC) 19 is more closely coupled to the patient head in image volume 18. As those in the art will appreciate, compared to the WBC, relatively small coils and/or arrays such as surface coils or the like are often customized for particular body parts (e.g., arms, shoulders, elbows, wrists, knees, legs, chest, spine, etc.), Such smaller RF coils are herein referred to as array coils (AC).

An MRI system controller 22 has input/output ports connected to display 24, keyboard 26 and printer 28. As will be appreciated, the display 24 may be of the touch-screen variety so that it provides control inputs as well.

The MRI system controller 22 interfaces with MRI sequence controller 30 which, in turn, controls the $G_x$, $G_y$ and $G_z$ gradient coil drivers 32, as well as the RF transmitter 34 and the transmit/receive switch 36 (if the same RF coil is used for both transmission and reception). The MRI sequence controller 30 includes suitable program code structure 38 for implementing preparatory and diagnostic MRI data acquisition sequences (e.g., including a preparatory relatively low resolution prescan image that provides a map of MRI response intensities for use in compensatory "shimming" adjustments to later acquired diagnostic MRI data in conjunction with other (e.g., conventional diagnostic) MRI sequences already available in the repertoire of the MRI sequence controller 30). In this exemplary embodiment, a patient shimming preparatory sequence has been modified to include at least one decoupling RF pulse to decouple fat protons in an ROI and thus permit more effective fat separation during a subsequent diagnostic MRI data acquisition sequence employing a fat suppression technique.

The MRI system 20 includes an RF receiver 40 providing input to data processor 42 so as to create processed image data, which is sent to display 24. The MRI data processor 42 is also configured for access to previously acquired shimming data for the imaged volume of diagnostic interest and to image reconstruction program code structure 44 and to MAP and MRI image memory 46 (e.g., for storing image data derived from processing in accordance with the exemplary embodiments image reconstruction program code structure 44).

Also illustrated in FIG. 1 is a generalized depiction of an MRI system program store 50 where stored program code structures (e.g., for enhanced fat-free MRI by decoupling fat protons during a preparatory shimming sequence, operator inputs, etc.) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of a B1 intensity-corrected imaging reconstruction process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient anatomy over an imaged volume space). As those in the art will appreciate, such arrays of stored data values represent and also constitute a physical structure—as does a particular structure of computer control program code that includes executable instructions which, when sequentially loaded into instruction registers and executed by one or more CPUs of the MRI system 20, cause a particular sequence of operational states to occur and be transitioned through within the MRI system.

The exemplary embodiments described below provide improved ways to process MRI data acquisitions and/or to generate and display MR images.

There are many known fat suppression MRI techniques, wherein particularly designed MRI pulse sequences cause the NMR (nuclear magnetic resonance) signals from hydrogen-containing lipids (mostly $CH_2$) to be reduced as compared to the NMR signals emanating from water ($H_2O$) containing tissues. Some known fat suppression sequences are: CHESS (CHEmical Shift Selective), STIR (Short TI (inversion time) Recovery), SPIR (SPectral-selective Inversion Recovery), PASTA (Polarity Alternated Spectral and spaTial Acquisition), SPAIR (SPectral-selective Adiabatic Inversion Recovery), Dixon-based (pixel level subtraction/addition of images based on oppositely phased fat or water NMR signals to produce resultant "water" or "fat" images), Double Fat Suppression (DFS), water-fat-opposed phase (WFOP), etc. The WFOP technique utilizes both CHESS (SPIR or SPAIR) and Dixon-type sequences to suppress both saturated (aliphatic) (major: >90% of total fat) and unsaturated (olefinic) (minor: <10% of total fat) fat signals.

Some frequency-selective fat suppression techniques (e.g., CHESS, SPIR, PASTA, DFS) have a problem in that they are susceptible to B0 and B1 inhomogeneity, frequency dispersion resonance of nuclei species peaks due to body shapes and/or tissues, such as bone and air susceptibility effects, imperfect TI (time to inversion for fat signal cancellation) due to frequency-selective RF pulses, etc. For example, due to susceptibility effects, fat resonance peaks sometimes shift off from the expected fat resonance peak (−3.5 ppm from water). Therefore, even if the expected "on-resonance" fat peak is suppressed, off-resonance (i.e., unexpected or unwanted) fat peaks may remain. Furthermore, fat peaks arise due to natural molecular and/or nuclear coupling to neighboring protons (e.g., J-coupling) and this also results in multiple different fat resonant frequency peaks.

When frequency-selective fat suppression methods are used, the unwanted off-resonance fat peaks preferably should also be addressed. For example, plural H1 coupled spectra of fat signals in the shimming spectra can present a puzzle to an operator trying to select which peak is the expected on-resonance fat signal (−3.5 ppm from water). This can be due to multiple coupling of protons (J-coupling) with neighboring protons and/or shifting susceptibility values for differently situated protons. Many overlapping fat peaks make it difficult to see the effective center peak of the complex of fat signals. The exemplary embodiments described below simplify the complex of fat peaks by decoupling them prior to obtaining the ROI shimming spectra—even if there remain some complexities due to susceptibility offsets due to water, air, tissues, etc. in the region of interest (ROI).

To help address the problem of imperfect unwanted chemical shifts (e.g., caused by differing susceptibility), the exemplary embodiments described below may be used. For example, in a pre-sequence shimming spectrum, it is easier to observe water and decoupled fat signals—where a decoupling process just prior to patient shimming data acquisition may provide substantially only one water peak and only one fat peak (i.e., with fat signals decoupled from neighboring protons) for at least some tissues of interest. This is preferably accomplished once per the region of shimming, which takes place before a regular fat suppression T1W, T2W, PD, etc., MRI data acquisition sequence. Although exemplary embodiments may merely change the pre-sequence shimming process (and its associated setting of parameters for a subsequent fat suppressed MRI data acquisition sequence diagnostic scan), the result can be more accurate determination of the effective or average center frequency difference between fat and water protons (i.e., now better taking into account susceptibility offsets due to water, air, tissues, etc.).

In order to decouple fat proton signals (i.e., to hopefully produce only one observed resonant fat peak in the NMR spectrum of protons to be imaged), one or multiple RF decoupling pulses can be applied during a patient shimming pre-scan, e.g., prior to the usual alpha RF nutation pulse used to acquire a patient shimming spectrum for a particular ROI. Amplitudes of spectral signal responses show relative amounts of fat and water signals in the ROI. To suppress unwanted "off-resonance" fat peaks in the water-fat opposed technique, SPIR, SPAIR or DFS may be applied to suppress the expected main resonance fat peak. Off-resonance unwanted fat peaks can be cancelled out from the water signal by opposed phase MRI data acquisition sequence techniques. For example, in order to suppress unwanted off-resonance fat peaks appearing in the patient shimming spectrum, the normally expected main off-resonance fat peak (which is −3.5 ppm from water and which is the usual or expected "on-resonance" fat peak) is detected after the shimming alpha pulse and a tau time (e.g., TI) for use in a subsequent fat-suppression acquisition sequence can be automatically calculated to adjust the sequence accordingly in the usual ways known to those in the art.

To also find and address the unwanted off-resonance fat peaks, shimming spectra can be thresholded (to locate fat peaks) and calibrated (e.g., curve fitting can be used to find a best "average" fat peak frequency). One or more decoupling RF pulses can be applied in the patient shimming sequence to decouple fat protons and thereby simplify the fat peak spectrum to be curve-fitted and later addressed by a suitable fat suppression diagnostic sequence. A suitably calculated tau time (e.g., TI) and/or spectrally selective RF pulse can then be determined and applied in a subsequent opposed-phase or other desired type of fat suppression diagnostic MRI data acquisition sequence. For example, in the PASTA opposed-phase technique, a spectrally selective water excitation pulse may also irradiate unwanted fat signals. But now, when a simplified (decoupled) fat spectrum is at hand, the fat peaks may be used to calculate and apply a new tau time in a subsequent MRI data acquisition sequence (e.g., to make undesired fat signals of opposite phase for fat signal cancellation). After PASTA excitation, there may still be unwanted fat signals that remain—but which can be cancelled out by Dixon-type opposed phase techniques (e.g., a Dixon type asymmetric spin echo (SE) acquisition sequence) as will be understood by those in the art.

The decoupling RF pulse(s) used during a shimming pre-scan procedure can be a simple continuous wave RF pulse of suitable frequency, duration, bandwidth, etc., as will be appreciated by those skilled in the art. Normally, it is designed and used for heterogeneous spin decoupling of protons like H1 decoupled C13 spectra. Here, fatty chain protons can be decoupled by a continuous RF wave pulse.

As those skilled in the art will appreciate, there are known proton decoupling sequences designed to actively decouple proton resonances in order to improve discrimination of other nuclei in diagnostic MRI data acquisition. The present exemplary embodiment contemplates using any of such known decoupling sequences—but now as part of a patient ROI shimming pre-sequence.

In order to reduce heterogeneity of fat resonance peaks (since that would make it easier to observe water and decoupled fat signals, especially if that results in only one water peak and one fat peak), decoupling of fat proton signals (e.g., to produce only one fat peak), one or multiple RF decoupling pulses may be applied in the pre-diagnostic scan ROI shimming process (e.g., prior to an alpha RF nutation pulse used to acquire a shimming spectrum). This allows a simplified spectrum of water (e.g., one peak) and fat (e.g., one peak).

To suppress all unwanted fat signals, including off-resonance fat peaks ("off-resonance" from the main fat peak, which is typically at −3.5 ppm from the water peak):

(i) in water-fat opposed techniques, e.g., SPIR, SPAIR or DFS, diagnostic MRI data acquisition sequences can be applied to suppress the main resonance fat peak, and off-resonance unwanted fat peaks can also be cancelled out from water signals by use of known opposed-phase techniques.

(ii) the main off-resonance fat peak to be addressed (e.g., that which is located closest to the desired water signal peak and thus between the water signal and the "on-resonance" or main fat peak at −3.5 ppm) is detected after decoupled H1 patient ROI shimming and a tau time (e.g., TI) for use in a subsequent MRI data acquisition sequence is automatically calculated to adjust the diagnostic sequence for better fat cancellation.

(iii) to find off-resonance fat peaks, decoupled (and thus simplified) pre-scan shimming spectra are calibrated with a threshold (by comparing the threshold to peak height) and conventional curve-fitting to find the best "average" resonance of all unwanted fat peaks.

Shimming with one or more decoupling RF pulses during the pre-scan shimming procedure can effect a good estimate of the effective main fat peak frequency. The resulting shimming spectrum will have somewhat simpler peaks, such as, hopefully, one water peak and, hopefully, one fat peak. However, there are susceptibility effects that cause shifting of some fat peaks to be off-resonance from the main fat peak (i.e., expected to be at −3.5 ppm from the water peak). In this case, multiple techniques can be used for fat suppression, e.g.:

(i) multiple spectral-selective pulses (like DFS) can be used to apply different frequency excitations; and (ii) a combination of opposed-phase type acquisition sequences like Dixon can be used where the main fat peak is suppressed by a spectrally-selective pulse and other displaced fat peaks (e.g., a second fat peak) are suppressed by opposed-phase techniques when using a spin echo (SE) type diagnostic MRI data acquisition sequence.

The exemplary embodiments may provide greater robustness in fat suppression using spectral-selective methods. The exemplary embodiments may, for example:

use shimming with one or more decoupling pulses to uncouple fat spectra;

identify the fat peak frequencies (which are split by susceptibility effects);

identify off-resonance fat peaks and apply a second spectrally-selective pulse or apply opposed-phase pulses in SE data acquisition sequences;

use shimming calibration to identify unwanted fat signals and determine an appropriate threshold;

after identifying the unwanted fat peak(s), provide a calibrated suitable tau time (e.g., with conventional curve-fitting techniques) for use in opposed-phase acquisition sequences to fit in the SE sequence; and in some cases, a second decoupling pulse may be used to sharpen up the frequency profile even more, while not disturbing the water signal.

Figure 2A:
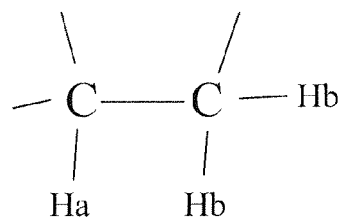
FIG. 2a is a partial schematic diagram of a typical molecular structure for a fat molecule.
Figure 2B:
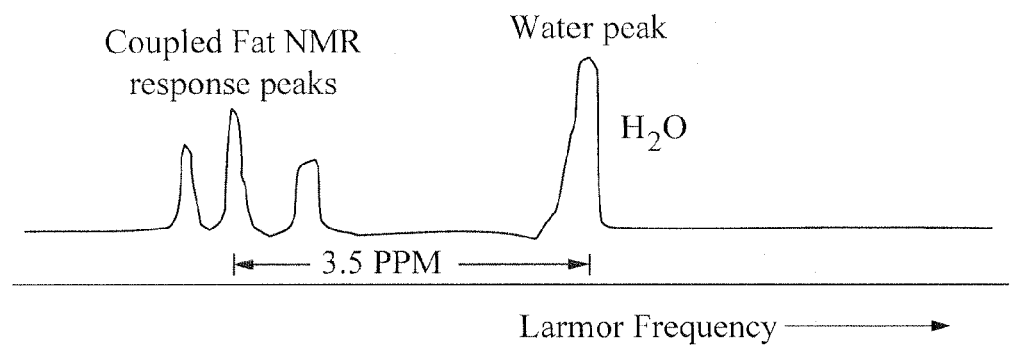
FIG. 2b depicts a "normal" pre-sequence patient shimming spectral display of an ROI (region of interest) showing coupled fat resonances.

The schematic partial molecular diagram of FIG. 2a depicts fat proton Ha coupled with two protons Hb to provide a triplet fat NMR signal response in the spectral shimming response depicted at FIG. 2b.

Figure 3:
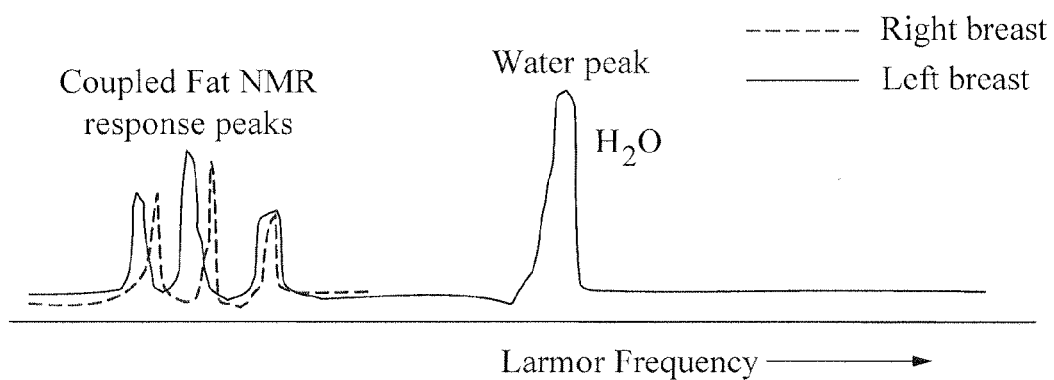
FIG. 3 depicts a "normal" pre-sequence patient shimming spectral display of an ROI showing coupled fat resonances for spatially separated (e.g., left and right breast) tissues.
Figure 4:
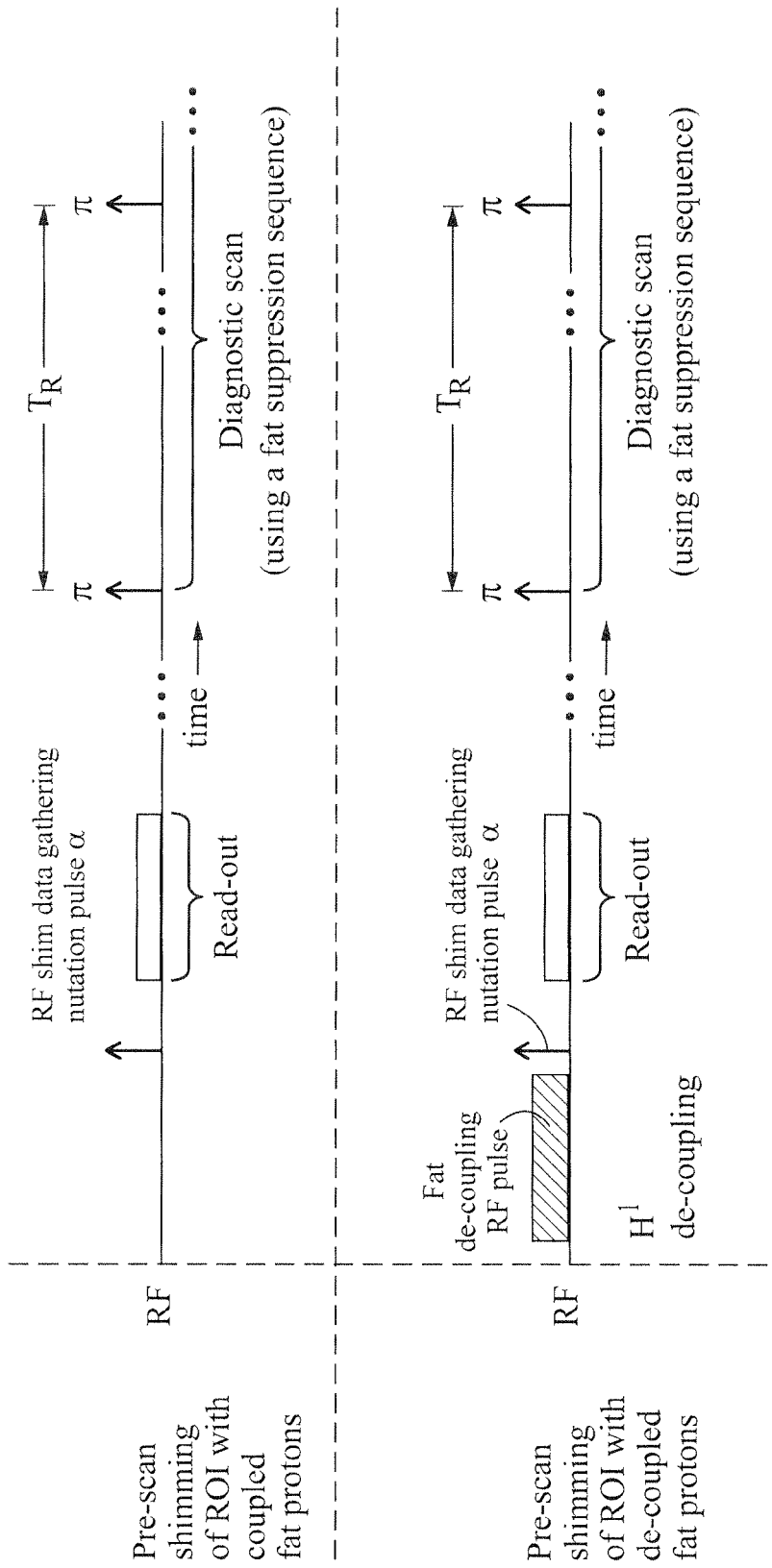
FIG. 4 schematically depicts normal and fat decoupled patient shimming pre-sequences for an ROI—followed by a fat suppression type of MRI data acquisition sequence.

That is, in the "normal" patient shimming pre-sequence process as depicted at the top portion of FIG. 4 (with fat protons still coupled), the spectral response resulting from the readout RF shimming data gathered after the nutation pulse a may produce a triplet of NMR fat responses as depicted in FIG. 2b. The expected main fat peak at −3.5 ppm from water is thus accompanied by two smaller peaks, one to each side. In a typical application where signals from both the right and left breast tissues are superimposed, the situation may be even more complicated as depicted in FIG. 3.

An adjustable threshold value can be used to compare with the NMR responses so as to separate out and measure the approximate frequency of each decoupled (or coupled if an earlier shimming spectrum is obtained in the "normal" manner) fat NMR fat peak. Once the NMR response peaks have been identified in the frequency spectrum (e.g., using a simplified decoupled average fat peak and spectral width estimated by, e.g., thresholding, calibrating via curve fitting techniques, etc), then suitable adjustments may be made in a subsequent fat suppression MRI data acquisition sequence so as to provide better compensation for these plural fat peaks.

Figure 5:
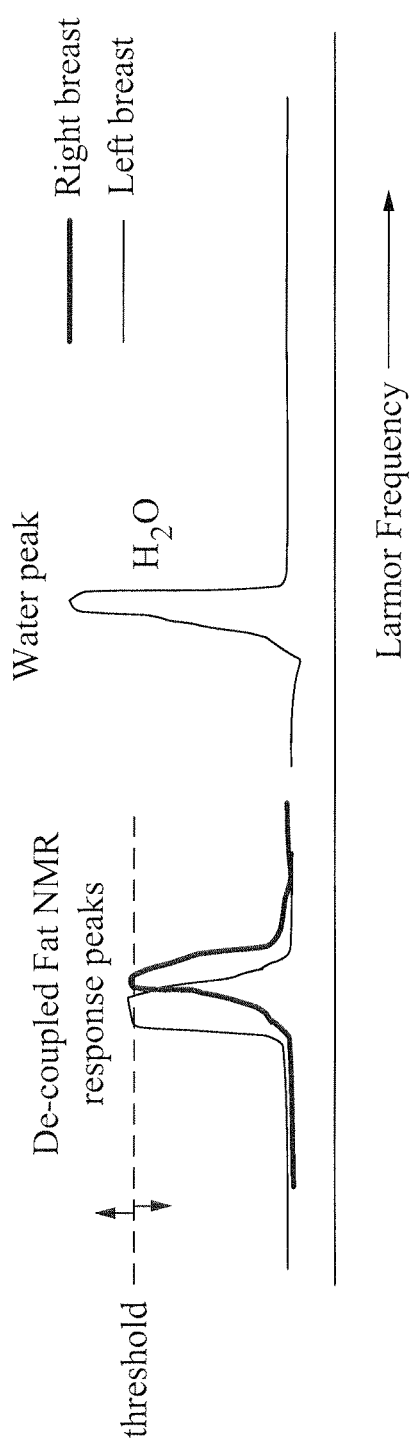
FIG. 5 schematically depicts a decoupled patient shimming spectral display showing simplified decoupled single fat resonant peaks for left and right breast tissues.

When there are two relatively large signal sources separated in space (like right and left breast tissues), a quite complicated spectrum may result as depicted in FIG. 3. However, once they are subjected to a fat decoupling RF pulse (e.g., as depicted in the lower half of FIG. 4), then the spectrum becomes more simple as depicted in FIG. 5. Here, with a greatly simplified spectrum of fat peaks, calculation of an appropriate TI interval (or spectrally selective RF pulse) for use in subsequent fat suppressed MRI data acquisition sequences becomes much more simple—as does the thresholded calibration/determination of fat response peaks in the spectrum.

Figure 6:
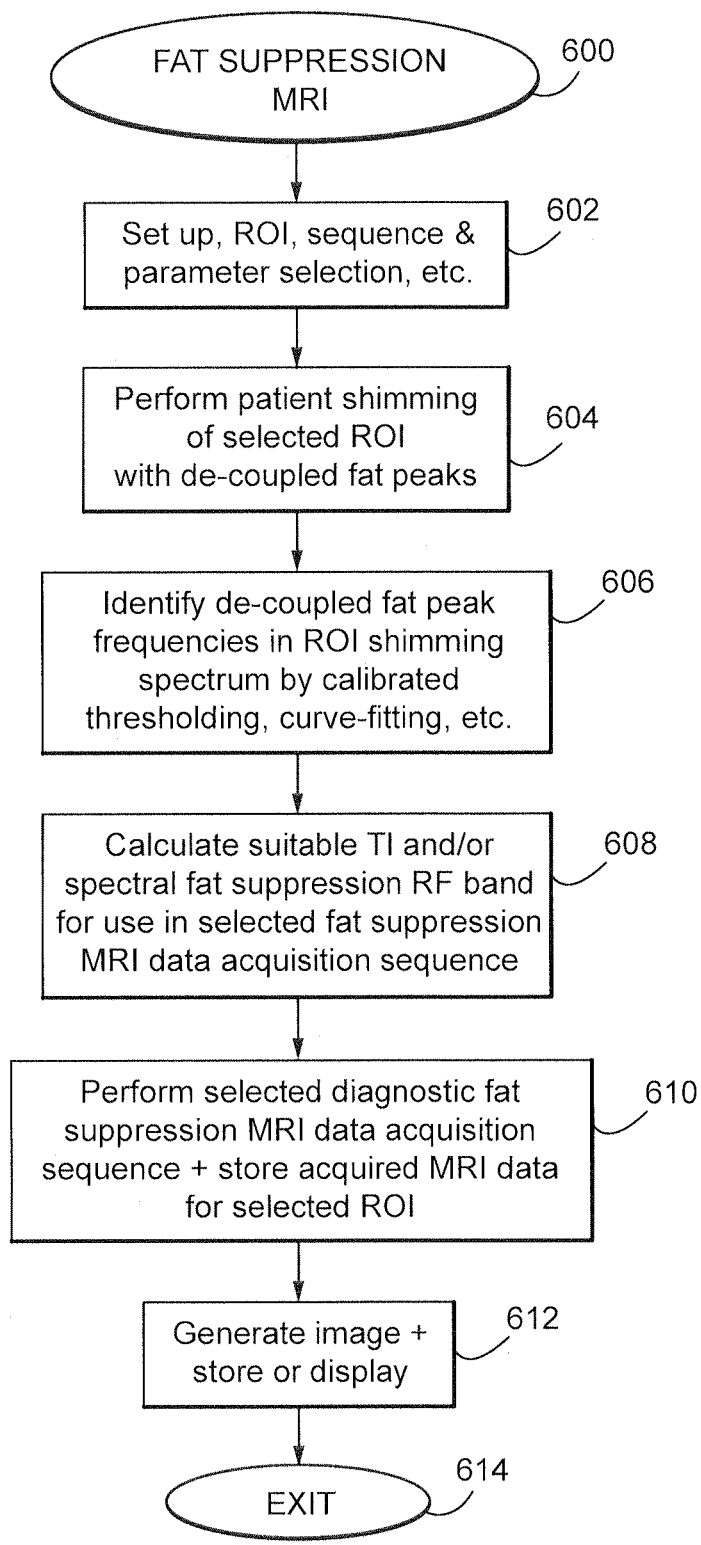
FIG. 6 schematically depicts an exemplary executable computer program control code structure for use in the MRI system of FIG. 1.

One exemplary fat suppression MRI sequence sub-routine is entered at 600 in FIG. 6. At 602, the usual ROI, sequence, parameter selections and other desired set-up and/or initialization procedures are performed.

At 604, patient shimming with decoupled fat peaks is performed so as to generate a simplified shimming spectral display such as seen in FIG. 5. At 606, the simplified decoupled fat peak frequency (or frequencies) is (are) identified by calibrated thresholding and curve-fitting techniques. For example, the peak amplitude(s) can be compared to an adjustable threshold so as to determine the number and location of the fat response peaks in the frequency spectrum—followed by suitable curve fitting to find a best fit average fat peak value (e.g., if only a single TI value is desired or needed for the selected subsequent diagnostic scan).

Subsequently, at 608 in FIG. 6, a suitable inversion interval (TI) and/or spectrally selective RF pulse parameter values are calculated for use in the selected subsequent fat suppression MRI data acquisition sequence. As will be appreciated, different TI values and/or spectrally selective RF pulses may be utilized to accommodate the different fat peaks.

Thereafter, at 610 in FIG. 6, the previously selected diagnostic fat suppression MRI data acquisition sequence is performed and the resulting acquired MRI data is stored. At 612, the acquired MRI data for the ROI is used to generate tissue image data that is either stored and/or displayed before exiting this sub-routine at 614.

While certain embodiments of the invention have been described, these embodiments have been presented by way of example only, and are not intended to limit the scope of the invention. Indeed, the novel methods and systems described herein may be embodied in a variety of other forms. Furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A magnetic resonance imaging (MRI) system comprising:
   an MRI gantry including a static magnet structure, controllable gradient magnet structures and at least one radio frequency (RF) coil for transmitting and receiving RF signals to and from an imaging volume;
   control circuits configured to control gradient magnetic fields generated by said gradient magnet structures, to transmit/receive RF signals to and from said at least one RF coil and to process RF signals received during a diagnostic MRI scan to produce displayable images of structures located within said imaging volume,
   said control circuits being configured to include at least one preparatory fat decoupling RF pulse as part of a patient shimming sequence effected prior to said diagnostic MRI scan sequence.

2. The MRI system of claim 1, wherein:
   said at least one fat decoupling RF pulse occurs prior to an RF nutation pulse used to thereafter gather RF spectral response data used for shimming detected non-uniformities in static and/or gradient magnetic fields within a region of interest (ROI) of patient tissue to be imaged.

3. The MRI system of claim 1 wherein:
   said control circuits are configured to include said at least one preparatory fat decoupling pulse as a preparatory part of each of plural ROI shimming pre-scan sequences.

4. The MRI system of claim 1, wherein:
   said at least one fat decoupling RF pulse occurs prior to an RF nutation pulse used to gather RF response data used for shimming detected non-uniformities in RF fields associated with said at least one RF coil.

5. The MRI system of claim 1, wherein said fat decoupling RF pulse is configured to decouple fat protons in a region of interest (ROI) of patient tissue to be imaged and thus effectively sharpen a collective resonant Larmor frequency peak for said fat protons.

6. The MRI system of claim 1, wherein said control circuits are configured to perform a shimming preparatory sequence which produces at least one fat resonant frequency peak that is not substantially 3.5 ppm away from a resonant peak for water protons.

7. The MRI system of claim 6, wherein said at least one resonant fat resonant frequency peak is used to determine and apply a respectively corresponding calculated time to inversion (TI) for fat protons in a polarity alternated spectral and spatial acquisition (PASTA) sequence.

8. The MRI system of claim 7, wherein said at least one resonant fat frequency peak is reduced by applying a compensating different TI in the PASTA acquisition sequence so as to generate an opposingly phased and thus at least partially cancelling fat signal response.

9. A magnetic resonance imaging (MRI) method comprising:
   using an MRI gantry including a static magnet structure, controllable gradient magnet structures and at least one radio frequency (RF) coil for transmitting and receiving RF signals to and from an imaging volume;
   controlling gradient magnetic fields generated by said gradient magnet structures, and transmitting/receiving RF signals to and from said at least one RF coil and to process RF signals received during a diagnostic MRI scan to produce displayable images of structures located within said imaging volume, and
   including at least one preparatory fat decoupling RF pulse as part of a patient shimming sequence effected prior to said diagnostic MRI scan sequence.

10. The MRI method of claim 9, wherein:
    said at least one fat decoupling RF pulse occurs prior to an RF nutation pulse used to thereafter gather RF spectral response data used for shimming detected non-uniformities in static and/or gradient magnetic fields within a region of interest (ROI) of patient tissue to be imaged.

11. The MRI system of claim 9, wherein:
    said at least one preparatory fat decoupling pulse is included as a preparatory part of each of plural ROI shimming pre-scan sequences.

12. The MRI method of claim 9, wherein:
    said at least one fat decoupling RF pulse occurs prior to an RF nutation pulse used to gather RF response data used for shimming detected non-uniformities in RF fields associated with said at least one RF coil.

13. The MRI method of claim 9, wherein said fat decoupling RF pulse is configured to decouple fat protons in a region of interest (ROI) of patient tissue to be imaged and thus effectively sharpen a collective resonant Larmor frequency peak for said fat protons.

14. The MRI method of claim 9, wherein said shimming preparatory sequence produces at least one fat resonant frequency peak that is not substantially 3.5 ppm away from a resonant peak for water protons.

15. The MRI method of claim 14, wherein said at least one resonant fat resonant frequency peak is used to determine and apply a respectively corresponding calculated time to inversion (TI) for fat protons in a polarity alternated spectral and spatial acquisition (PASTA) sequence.

16. The MRI method of claim 15, wherein said at least one resonant fat frequency peak is reduced by applying a compensating different TI in the PASTA acquisition sequence so as to generate an opposingly phased and thus at least partially cancelling fat signal response.

17. A non-transient computer program storage medium storing executable computer program control instructions which, when executed by at least one computer of a magnetic resonance imaging (MRI) system effects the method of claim 9.

* * * * *